United States Patent
Kaga et al.

(10) Patent No.: US 8,586,493 B2
(45) Date of Patent: Nov. 19, 2013

(54) SILICON NITRIDE SINTERED BODY, METHOD OF PRODUCING THE SAME, AND SILICON NITRIDE CIRCUIT SUBSTRATE AND SEMICONDUCTOR MODULE USING THE SAME

(75) Inventors: Youichirou Kaga, Saitama (JP); Junichi Watanabe, Saitama (JP)

(73) Assignee: Hitachi Metals, Ltd., Tokyo (JP)

( * ) Notice: Subject to any disclaimer, the term of this patent is extended or adjusted under 35 U.S.C. 154(b) by 334 days.

(21) Appl. No.: 12/737,316

(22) PCT Filed: Jul. 3, 2009

(86) PCT No.: PCT/JP2009/062221
§ 371 (c)(1),
(2), (4) Date: Mar. 31, 2011

(87) PCT Pub. No.: WO2010/002001
PCT Pub. Date: Jan. 7, 2010

(65) Prior Publication Data
US 2011/0176277 A1 Jul. 21, 2011

(30) Foreign Application Priority Data
Jul. 3, 2008 (JP) .................................. 2008-174314

(51) Int. Cl.
*C04B 35/584* (2006.01)
*H01L 23/15* (2006.01)
(52) U.S. Cl.
USPC ......... 501/97.2; 501/97.3; 174/252; 174/256; 264/650; 264/683
(58) Field of Classification Search
USPC ......... 501/97.2, 97.3; 264/650, 683; 174/252, 174/256
See application file for complete search history.

(56) References Cited

U.S. PATENT DOCUMENTS

| | | | | |
|---|---|---|---|---|
| 4,609,633 A | * | 9/1986 | Fukuhara et al. | 501/97.2 |
| 6,294,244 B1 | * | 9/2001 | Iwaida et al. | 428/209 |
| 2009/0039477 A1 | | 2/2009 | Kaga et al. | |

FOREIGN PATENT DOCUMENTS

| | | |
|---|---|---|
| DE | 112006000992 T5 | 6/2008 |
| JP | 06-329470 | 11/1994 |
| JP | 07-267735 | 10/1995 |
| JP | 11-310464 | 11/1999 |
| JP | 2000-034172 | 2/2000 |
| JP | 2002128569 | * 5/2002 |
| JP | 2003-313079 A | 11/2003 |
| JP | 2005-255462 A | 9/2005 |
| JP | 2007-197226 A | 8/2007 |
| KR | 20080073635 A | 8/2008 |
| WO | WO 2006/118003 A1 | 11/2006 |

* cited by examiner

*Primary Examiner* — Karl Group
(74) *Attorney, Agent, or Firm* — Paul F. Neils; Edwards Neils PLLC (57) ABSTRACT

A silicon nitride sintered body, wherein in a silicon nitride substrate consisting of crystal grains of β-type silicon nitride and a grain boundary phase containing at least one type of rare earth element (RE), magnesium (Mg) and silicon (Si), the grain boundary phase consists of an amorphous phase and a $MgSiN_2$ crystal phase. The X-ray diffraction peak intensity of any crystal plane of a crystal phase containing the rare earth element (RE) is less than 0.0005 times the sum of the diffraction peak intensities of (110), (200), (101), (210), (201), (310), (320) and (002) of the crystal grains of the β-type silicon nitride; and the X-ray diffraction peak intensity of (121) of the $MgSiN_2$ crystal phase is 0.0005 to 0.003 times the sum of the X-ray diffraction peak intensities of (110), (200), (101), (210), (201), (310), (320) and (002) of the crystal grains of the β-type silicon nitride.

8 Claims, 4 Drawing Sheets

SILICON NITRIDE SINTERED BODY, METHOD OF PRODUCING THE SAME, AND SILICON NITRIDE CIRCUIT SUBSTRATE AND SEMICONDUCTOR MODULE USING THE SAME

CROSS-REFERENCE TO RELATED APPLICATIONS

The present invention is a 35 U.S.C. 371 National Stage Entry of PCT/JP2009/062221, filed Jul. 3, 2009, which claims priority from Japanese Patent Application No. 2008-174314, filed on Jul. 3, 2008, the contents of which are herein incorporated by reference in their entirety.

TECHNICAL FIELD

The present invention relates to a silicon nitride sintered body and a method of producing the same. The present invention also relates to a silicon nitride circuit substrate and a semiconductor module that use the above silicon nitride substrate.

BACKGROUND ART

In recent years, in the field of inverters for electric vehicles and the like, power semiconductor modules (such as IGBT or power MOSFET) are used that make a high-voltage/high-current operation possible. As a substrate used for power semiconductor modules, a ceramics circuit substrate can be used: The ceramic circuit substrate is made by joining a metallic circuit plate to one side of an insulating ceramics substrate and a metallic radiator plate to the other side. On the top surface of the metallic circuit plate, semiconductor elements and the like are mounted. So-called direct bonding copper method by which copper plates are directly joined, or active metal method that uses brazing filler metal, is adopted to join the above insulating ceramics substrate to the metallic circuit plate and the metallic radiator plate.

In such power semiconductor modules, the amount of heat generation increases as high current flows. However, the above insulating ceramics substrate is lower in thermal conductivity than the copper plate. Therefore, the above insulating ceramics substrate could play a role in preventing heat dissipation from the semiconductor elements. Moreover, based on a difference in the coefficient of thermal expansion between the insulating ceramics substrate and the metallic circuit and radiator plates, a thermal stress occurs, which could cause cracks on the insulating ceramics substrate and break the insulating ceramics substrate down, or cause the metallic circuit or radiator plate to come off from the insulating ceramics substrate. Therefore, to keep the excellent radiation performance of the insulating ceramics substrate, the high thermal conductivity and mechanical strength is required. A material of the insulating ceramics substrate is, for example, aluminum nitride or silicon nitride. An insulating ceramics substrate composed of aluminum nitride is high in thermal conductivity but low in mechanical strength, meaning such cracks could easily appear and that it is difficult for the insulating ceramics substrate to be used in a power semiconductor module having a structure in which a great amount of stress is applied to a ceramics substrate.

In PTL 1, which is mentioned below, an example of a silicon nitride substrate is disclosed. Twenty percent or more of a grain boundary phase is crystallized in order to reduce the proportion of a glassy phase that is low in thermal conductivity and increase the thermal conductivity of the silicon nitride substrate. Hereinafter, the above technique is referred to as a first conventional example. In PTL 2, which is mentioned below, an example of a silicon nitride ceramics material is disclosed. The grain boundary phase is made amorphous. Therefore, silicon nitride crystal grains are firmly combined thanks to the amorphous grain boundary phase, increasing the strength. Hereinafter, the above technique is referred to as a second conventional example. In PTL 3, which is mentioned below, an example of a silicon nitride radiator member is disclosed. Since the grain boundary phase contains a crystal phase made of $MgSiO_3$ or $MgSiN_2$, the high thermal conductivity silicon nitride radiator member is obtained. Hereinafter, the above technique is referred to as a third conventional example. In PTL 4, which is mentioned below, an example of a silicon nitride-based sintered body is disclosed. The grain boundary phase includes the crystal phase. It is reported that the sintered body is excellent in bending strength, fracture toughness and thermal shock resistance. Hereinafter, the above technique is referred to as a fourth conventional example.

CITATION LIST

Patent Literature

[PTL 1] Jpn. Pat. Appln. Publication No. 2000-34172
[PTL 2] Jpn. Pat. Appln. Publication No. H07-267735
[PTL 3] Japanese Patent No. 3561145
[PTL 4] Japanese Patent No. 3476504

DISCLOSURE OF THE INVENTION

Technical Problem

In the silicon nitride substrate of the above first conventional example, 20 percent or more of the grain boundary phase is crystallized to increase the thermal conductivity. The high thermal conductivity makes a contribution to decreasing the thermal resistance of the circuit substrate. In particular, when the silicon nitride circuit substrate is joined to a thick copper plate, the high mechanical strength is also required, given that implementation takes place at high temperature and semiconductor modules operate at high temperature. The first conventional example refers to bending strength. However, achieving the above bending strength is limited to the case where a specific base powder is used for production under a specific production condition. In the silicon nitride ceramics material of the second conventional example, the grain boundary phase is made amorphous to obtain the ceramics material that is high in bending strength. However, thermal conductivity is not taken into account. In the silicon nitride radiator member of the third conventional example, the grain boundary phase contains a crystal phase made of $MgSiO_3$ or $MgSiN_2$, thereby improving the thermal conductivity. However, since $MgSiO_3$ and a RE-containing crystal phase are substantially included, the thermal conductivity is not high enough for the radiator member of semiconductor modules. Moreover, the bending strength is not sufficiently high. For the silicon nitride-based sintered body of the fourth conventional example, the improvements of the thermal shock resistance, bending strength and thermal conductivity are described. However, since a phase containing sialon whose thermal conductivity is low is formed, it is difficult for the silicon nitride-based sintered body to be applied for use in a radiator substrate.

The present invention has been made in view of the above conventional problems. The object of the present invention is to provide a silicon nitride substrate made of a silicon nitride sintered body that is high in strength and thermal conductivity and excellent in thermal shock resistance; a method of producing the silicon nitride substrate; and a silicon nitride circuit substrate and a semiconductor module that use the silicon nitride substrate.

Means for Solving the Problems

To achieve the above object, a silicon nitride sintered body according to the present invention is characterized in that: in a silicon nitride substrate consisting of crystal grains of β-type silicon nitride and a grain boundary phase containing at least one type of rare earth element (RE), magnesium (Mg) and silicon (Si), the grain boundary phase consists of an amorphous phase and a $MgSiN_2$ crystal phase; the X-ray diffraction line peak intensity of any crystal plane of a crystal phase containing the rare earth element (RE) is less than 0.0005 times the sum of the diffraction line peak intensities of (110), (200), (101), (210), (201), (310), (320) and (002) of the crystal grains of the β-type silicon nitride; and the X-ray diffraction peak intensity of (121) of the $MgSiN_2$ crystal phase is 0.0005 to 0.003 times the sum of the X-ray diffraction peak intensities of (110), (200), (101), (210), (201), (310), (320) and (002) of the crystal grains of the β-type silicon nitride.

According to the present invention, in the silicon nitride sintered body, thermal conductivity is 80 W/m·K or more.

The present invention is characterized in that, in the silicon nitride sintered body, the amount of magnesium (Mg) contained in the silicon nitride sintered body is 6.7 to 12.8 mol % of MgO, the amount of at least one type of rare earth element (RE) contained in the silicon nitride sintered body is 1.1 to 2.9 mol % of rare-earth element oxide ($RE_2O_3$), the total amount of MgO and $RE_2O_3$ contained is 7.9 to 15.1 mol %, and a molar ratio of ($RE_2O_3$)/(MgO) is 0.09 to 0.3.

The present invention of a method of producing a silicon nitride sintered body is characterized by comprising the steps of: mixing 6.7 to 12.8 mol % of magnesium oxide (MgO) and 1.1 to 2.9 mol % of at least one type of rare-earth element oxide ($RE_2O_3$) into a base powder of silicon nitride whose oxygen content is less than or equal to 2.0 percent by mass so that the total amount comes to 7.9 to 15.1 mol % and the molar ratio of ($RE_2O_3$)/(MgO) to 0.09 to 0.3; forming a sheet formed body that is 40 mm or less in total thickness; heating the sheet formed body from 1,600 degrees Celsius to 1,800 to 2,000 degrees Celsius at a rate of 300 degrees Celsius/h or less; and cooling the sheet formed body down to 1,500 degrees Celsius at a rate of 100 degrees Celsius/h or more for sintering after keeping the sheet formed body for 2 to 10 hours.

The present invention of a silicon nitride circuit substrate is characterized by comprising: a silicon nitride substrate made of the silicon nitride sintered body as discussed above; a metallic circuit plate that is bonded to one side of the silicon nitride substrate; and a metallic radiator plate that is bonded to the other side of the silicon nitride substrate.

The present invention of a semiconductor module is characterized by comprising: the silicon nitride circuit substrate as discussed above; and a semiconductor element mounted on the silicon nitride circuit substrate.

Advantageous Effects of the Invention

According to the present inventions as disclosed, it is possible to realize a silicon nitride substrate that is high in strength and thermal conductivity.

According to the present invention, it is possible to provide a method of producing a silicon nitride substrate that is high in strength and thermal conductivity.

According to the present invention, it is possible to realize a silicon nitride circuit substrate in which cracks are inhibited.

According to the present invention, it is possible to realize a semiconductor module in which cracks are inhibited.

BEST MODE FOR CARRYING OUT THE INVENTION

The following describes the best mode for carrying out the invention (which is referred to as an embodiment, hereinafter).

According to an embodiment of the present invention, in a silicon nitride substrate that is used as an insulating ceramics substrate for the above power semiconductor modules and the like and includes β-type silicon nitride crystal grains and a grain boundary phase containing at least one type of rare earth element (RE), magnesium (Mg) and silicon (Si), the grain boundary phase is made up of an amorphous phase and a $MgSiN_2$ crystal phase and does not substantially include a crystal phase containing the rare earth element (RE).

In general, the silicon nitride sintered body consists of β-type silicon nitride crystal grains and a grain boundary phase containing sintering-aid components; the grain boundary phase consists of an amorphous or crystal phase. For the grain boundary phase, a diffraction pattern on a surface of a substrate is measured by an X-ray diffraction method. The detected peak of the diffraction pattern other than β-type $Si_3N_4$ is identified to make a determination as to whether each crystal phase in the grain boundary phase exists. When the X-ray peak of the crystal phase containing Mg is not detected, it is determined that Mg exists as an amorphous phase in the grain boundary phase. When the X-ray peak of the crystal phase containing RE is not detected, it is determined that RE exists as an amorphous phase in the grain boundary phase. Specifically, when the diffraction peak intensity of any grain boundary/crystal phase is less than 0.0005 times the sum of the diffraction peak intensities of (110), (200), (101), (210), (201), (310), (320) and (002) of β-type $Si_3N_4$, then it is determined that the grain boundary phase does not contain the crystal phase. For $MgSiN_2$, an X-ray peak of (121) is a first peak; For a RE component, X-ray peaks of (211), (112) and (−221) are first peaks for $Re_2Si_3O_3N_4$, $Re_2SiO_3N$ and $Re_4Si_2O_3N_3$, respectively. Whether or not the crystal phase exists is determined by calculation with the use of the ratios of the above X-ray peaks to the sum of the diffraction line peak intensities of (110), (200), (101), (210), (201), (310), (320) and (002) of β-type $Si_3N_4$.

Thanks to the observation that uses a transmission electron microscope (Transmission Electron Microscope: TEM), whether or not the crystal phase in the grain boundary phase has been separated out is confirmed. An analysis of images is conducted to calculate the abundance ratio (area ratio) of the crystal phase in the grain boundary phase (the sum of the amorphous phase and the grain boundary/crystal phases).

As described above, the silicon nitride substrate consists of silicon nitride grains and a grain boundary phase that mainly contains components added as sintering aids. The grain boundary phase, which is generated with the added sintering aids as the main components, plays a role in keeping the silicon nitride grains bonded together and reducing defects between the grains. In particular, if there is a coarse defect on the surface because of the insufficient bonding force of the grain boundary phase of the silicon nitride substrate, a mechanical breakdown is triggered by the defect and takes place easily when stress is applied to the silicon nitride substrate. Therefore, it is necessary for the grain boundary phase to exist after being uniformly dispersed in order to bond the grains together and to prevent generation of coarse defects.

Figure 1:
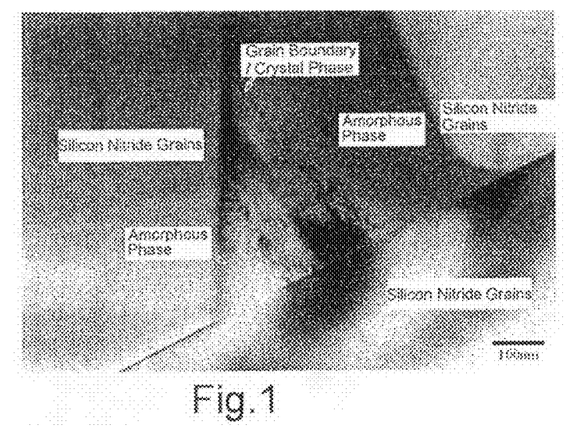
FIG. 1 is a transmission electron microscope (TEM) image of silicon nitride grains and grain boundary phase of a silicon nitride sintered body according to the present invention.
Figure 2:
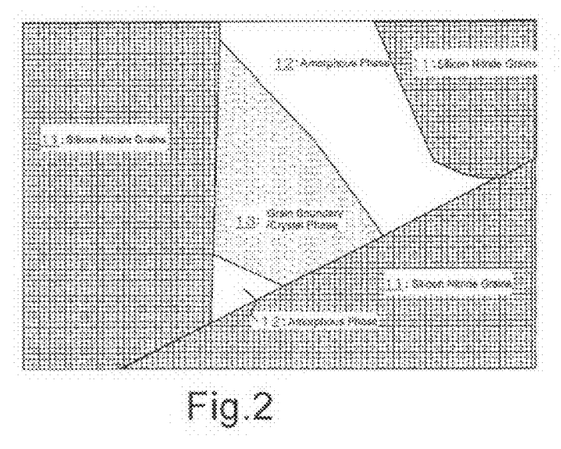
FIG. 2 is a schematic diagram of the TEM image of FIG. 1.
Figure 3:
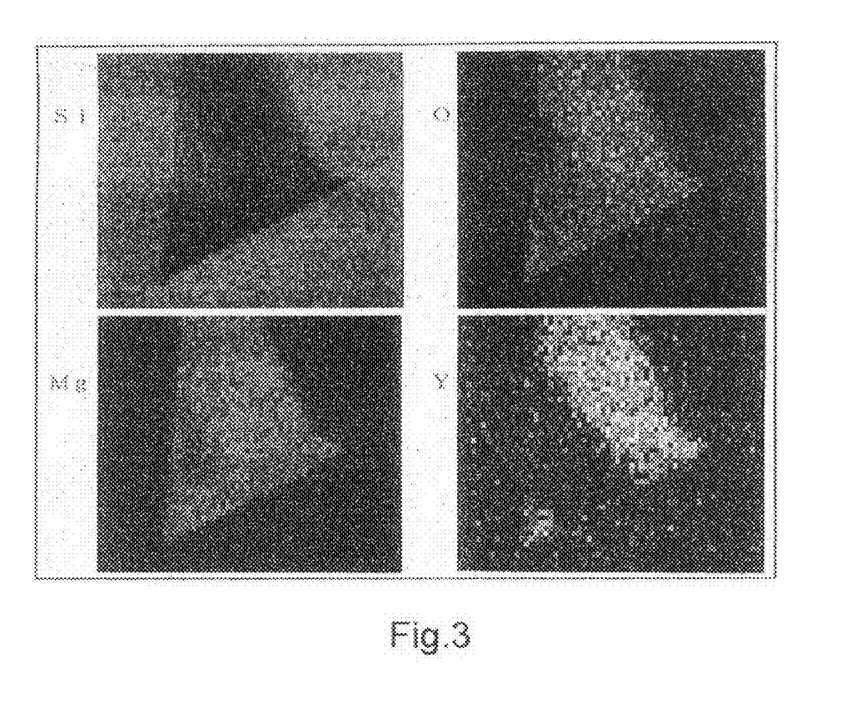
FIG. 3 shows a result of an analysis for Si, Mg, Y and O components by TEM-EDX of FIG. 1.
Figure 6:
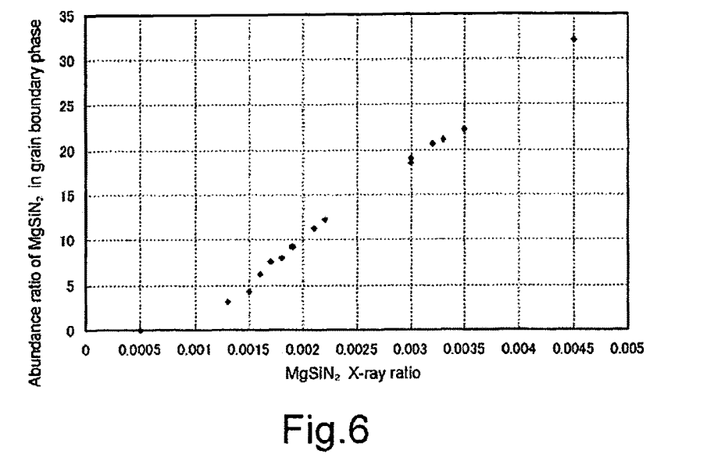
FIG. 6 shows a relationship between an abundance ratio of $MgSiN_2$ in grain boundary/crystal phase derived from the TEM image and X-ray intensity ratio of $MgSiN_2$.

MgO and $RE_2O_3$, which are added as sintering aids in the silicon nitride substrate, react with $Si_3N_4$ or $SiO_2$ that $Si_3N_4$ contains to form a liquid phase in a sintering process. After the sintering process, the liquid phase exists as a grain boundary phase, amorphous phase or crystal phase. FIG. 1 shows a transmission electron microscope (TEM) image of the silicon nitride grains and grain boundary phase of the silicon nitride sintered body of the present invention; FIG. 2 is a schematic diagram thereof (described later in Example 4). FIG. 6 shows the results of composition analysis for components of Si, Mg, Y and O by TEM-EDX (Transmission Electron Microscope-Energy Dispersive X-ray Spectrometry) in plane. The high concentration of the O component means an amorphous phase in the case of a grain boundary phase. As for the composition, it is obvious from FIG. 6 that, in crystal phases 13 whose contrasts are different in a grain boundary phase, that is sandwiched by silicon nitride grains 11 in FIG. 1, the detected concentrations of Y and O are low, and that Mg and Si are main components. Since the peak of $MgSiN_2$ is only detected from a result of X-ray diffraction, the grain boundary/crystal phases 13 are composed of $MgSiN_2$. Meanwhile, for a grain boundary phase section 12 other than the crystal phase 13, the concentration of the Si component is low; the grain boundary phase section 12 is composed of the Mg, Y and O components mainly. Moreover, no diffraction peak, except that of $MgSiN_2$, is detected by X-ray diffraction. Accordingly, there is an amorphous phase that is mainly composed of the Y, Mg and O components. The grain boundary phase consisting of the amorphous phase 12 and the grain boundary/crystal phases 13 bonds the silicon nitride grains 11 together; the abundance ratio of both affects the mechanical strength and thermal conductivity of the silicon nitride sintered body. It is preferable that the abundance ratio (area ratio in the plane) of the grain boundary/crystal phases 13 ($MgSiN_2$) to the grain boundary phase in the silicon nitride sintered body be in a range that is greater than or equal to 0.05% and less than 20%. By precipitation of the grain boundary/crystal phase, which is better in thermal conductivity than the amorphous phase 12, it is possible to increase the thermal output conductivity of the sintered body. In particular, since the Mg crystal phase is better in thermal conductivity than crystal phases made of other components, the effect thereof is great even if extremely small amounts are precipitated. Accordingly, in order to increase the thermal conductivity of the silicon nitride sintered body, it is desirable that the abundance ratio of the grain boundary/crystal phases $MgSiN_2$ to the grain boundary phase be greater than or equal to 0.05%. Meanwhile, if the grain boundary/crystal phases are precipitated excessively, the abundance ratio of the grain, boundary/crystal phases whose bonding strength to the silicon nitride grains is lower than the amorphous phase increases, resulting in a decrease in mechanical strength and great variation of the strength. Thus, it is preferable that the abundance ratio of the $MgSiN_2$ phase to the grain boundary phase be less than 20%.

In order to increase the mechanical strength of the silicon nitride substrate, it is desirable that the grain boundary phase containing Mg be included as an amorphous phase, which is used to keep the silicon nitride grains bonded together. Meanwhile, the $MgSiN_2$ crystal phase, which appears when the grain boundary phase containing Mg is crystallized, is higher in thermal conductivity than the amorphous phase, therefore, it is possible to improve the thermal conductivity of the silicon nitride substrate using this. Accordingly, a portion, or appropriate amount, of the Mg in the grain boundary phase is precipitated as the $MgSiN_2$ crystal phase that is relatively high in thermal conductivity to such a degree that the mechanical strength does not decrease significantly, thereby keeping the thermal conductivity of the silicon nitride substrate high. In the silicon nitride sintered body of the present invention where an appropriate amount of the $MgSiN_2$ crystal phase is precipitated in the grain boundary phase, the X-ray diffraction peak intensity of (121) of the $MgSiN_2$ crystal phase is 0.0005 to 0.003 times the sum of the X-ray diffraction peak intensities of (110), (200), (101), (210), (201), (310), (320) and (002) of β-type $Si_3N_4$.

As described above, the silicon nitride substrate of the present embodiment is characterized in that the grain boundary phase is made up of the amorphous phase and the $MgSiN_2$ crystal phase and a crystal phase containing RE is not substantially included. "Substantially not included" means that the X-ray diffraction peak intensity of any crystal plane of the crystal phase containing the rare earth element (RE) is less than 0.0005 times the sum of the diffraction peak intensities of (110), (200), (101), (210), (201), (310), (320) and (002) of β-type $Si_3N_4$. Therefore, it is possible to keep a high level of the bending strength of the silicon nitride substrate and improve the thermal conductivity. Incidentally, the way the grain boundary phase is adjusted is described below.

Moreover, the silicon nitride substrate of the present embodiment contains the $MgSiN_2$ crystal phase in such a way that the X-ray diffraction peak intensity of (121) of the $MgSiN_2$ crystal phase comes to 0.0005 to 0.003 times the sum of the X-ray diffraction peak intensities of (110), (200), (101), (210), (201), (310), (320) and (002) of β-type $Si_3N_4$. The less the $MgSiN_2$ crystal phase, the less effective the silicon nitride substrate is in raising the thermal conductivity. The more the $MgSiN_2$ crystal phase, the less effectively the silicon nitride grains are bonded together as a grain boundary phase. The bending strength also decreases. According to the present embodiment, in order to adjust the characteristics, the amount of the $MgSiN_2$ crystal phase falls within the above range.

In the silicon nitride substrate of the present embodiment, the amount of Mg contained is 6.7 to 12.8 mol % of MgO; the amount of RE contained is 1.1 to 2.9 mol % of $RE_2O_3$. Moreover, the amount of Mg contained, and the amount of RE contained, range from 7.9 to 15.1 mol % of MgO or of $RE_2O_3$ respectively in total. When the amounts are converted to oxides, Mg and RE are contained so that the molar ratio of $(RE_2O_3)/(MgO)$ is in the range of 0.09 to 0.3. Mg and RE serve as sintering aids when the silicon nitride substrate is produced. Since Mg and RE exist mainly as a grain boundary phase in the produced silicon nitride substrate, the amount of Mg and RE contained affects the characteristics, such as bending strength and thermal conductivity, of the silicon nitride substrate. If the molar ratio of $(RE_2O_3)/(MgO)$ is less than 0.09, the generation of the $MgSiN_2$ crystal phase is reduced when being sintered, resulting in a decrease in thermal conductivity. If the molar ratio of $(RE_2O_3)/(MgO)$ is greater than 0.3, the crystallization of the grain boundary phase is accelerated when being sintered, and the crystal phase containing RE in a grain boundary is precipitated, weakening the bonding of the silicon nitride grains and resulting in a decrease in bending strength. Even with the molar ratio of $(RE_2O_3)/(MgO)$ being within the above range, if the amount of MgO or $RE_2O_3$ contained or the total amount of both does not reach the above range, the generation of the $MgSiN_2$ crystal phase is reduced when being sintered, resulting in a decrease in thermal conductivity, as well as a decline in bending strength due to the insufficient sintering. If the amount of $RE_2O_2$ contained or the total amount thereof is greater than the above range, the amount of the grain boundary phase whose thermal conductivity is lower than the silicon nitride grains increases significantly, leading to a drop in thermal conductivity. If only the amount of MgO contained is large, only a large amount of the $MgSiN_2$ crystal phase is precipitated when being sintered, weakening the bonding of the silicon nitride grains and therefore leading to a decrease in bending strength. Thus, it is preferable that the amount of MgO contained, the amount of $RE_2O_2$ contained, the total amount of both and the molar ratio of $(RE_2O_3)/(MgO)$ be within the above ranges.

The silicon nitride sintered body of the present invention has a high bending strength and thermal conductivity. The thermal conductivity is preferably greater than or equal to 80 W/m·K, more preferably greater than or equal to 85 W/m·K, and still more preferably greater than or equal to 90 W/m·K. The bending strength is greater than or equal to 820 MPa. The thermal expansion coefficient between room temperature and 600 degrees Celsius is in the range of 2.3 to 4.5 ppm/degree Celsius; the relative density is greater than or equal to 98%, preferably greater than 99%. If the thermal expansion coefficient is less than 2.3 ppm/degree Celsius, the difference in thermal expansion from a metallic circuit plate increases. If the thermal expansion coefficient exceeds 4.5 ppm/degree Celsius, the thermal expansion of the substrate becomes larger, and cracks could appear in any case due to thermal shocks after made into a circuit substrate. If the relative density is less than 98%, it may be impossible to obtain 80 W/m·K or more in thermal conductivity and 820 MPa or more in bending strength. The silicon nitride substrate, which is produced from the silicon nitride sintered body of the present invention, can be used for various substrates such as circuit substrates for high-frequency transistors, power semiconductor modules and the like or substrates for multichip modules, as well as for members of electric components such as heat-transfer plates for Peltier elements or various kinds of heat sink for heat emitting elements. For example, when the silicon nitride substrate of the present embodiment is used as a substrate on which semiconductor elements are mounted, during a process of bonding the silicon nitride substrate and the metallic circuit and radiator plates together, a process of producing a power semiconductor module, or the case where a heat cycle is repeatedly applied as the power semiconductor module operates, it is possible to prevent generation of cracks. It is also possible to realize a substrate where the heat generated from the semiconductor elements is easily transferred to a radiator member, with improvements in thermal shock resistance, heat cycle resistance and heat dissipation.

To one or both sides of the silicon nitride substrate of the present embodiment, Cu (copper) circuit plates or Al (aluminum) circuit plates, which are the metallic circuit and radiator plates, are bonded with the use of a DBC (Direct Bonding Copper: Direct Bonding Copper Method) method, an active brazing filler metal method or the like. As a result, a silicon nitride circuit substrate is produced. According to the DBC method, the silicon nitride substrate and the Cu or Al circuit plate are heated in an inert-gas or nitrogen atmosphere at a eutectic temperature or higher; the above circuit plate is directly bonded to one or both sides of the silicon nitride substrate via eutectic compound layers, with the generated Cu—O or Al—O eutectic compound liquid phase serving as an adhesive. Meanwhile, according to the active brazing filler metal method, an active metal, such as titanium (Ti), zirconium (Zr) or hafnium (Hf), and metals for making a fusible alloy, such as silver (Ag) and copper (Cu), are mixed or turned into the alloy, which is used as a brazing filler metal; with the use of the brazing filler metal, the Cu or Al circuit plate is bonded to one or both sides of the silicon nitride substrate via brazing filler metal layers after being heated and compressed in an inert-gas or vacuum atmosphere. After the circuit plate is bonded, an etching process is performed on the Cu or Al circuit plate on the silicon nitride substrate to form a circuit pattern. After the circuit pattern is formed, the Cu or Al circuit plate is plated with Ni—P to produce the silicon nitride circuit substrate.

Moreover, appropriate semiconductor elements are mounted on the above silicon nitride circuit substrate to produce a desired semiconductor module.

The following describes a method of producing the silicon nitride substrate according to the present embodiment.

As for the silicon nitride powder, which serve as a base powder used in the present embodiment, the average diameter of grains is less than or equal to 1.0 μm; the specific surface area is within a range that is less than or equal to 15 m²/g. In order to increase the thermal conductivity of the silicon nitride sintered body, the oxygen content is less than or equal to 1.5 wt %; Fe and Al components, in particular, are each less than or equal to 1,000 ppm.

As for the MgO and $Y_2O_3$ powders that are added as sintering aids, the average diameter of grains is less than or equal to 1.0 μm; the specific surface is within a range that is less than or equal to 30 m²/g. As for the amount of impurities, as in the case of the silicon nitride powder, Fe and Al components are each less than or equal to 1,000 ppm.

First, in a process of adjusting ingredients and mixing, the silicon nitride base powder whose oxygen content is less than or equal to 2 percent by mass is mixed with 6.7 to 12.8 mol % of magnesium oxide (MgO) and 1.1 to 2.9 mol % of at least one type of rare-earth element oxide ($RE_2O_3$) so as to come to 7.9 to 15.1 mol % in total, with the molar ratio of $(RE_2O_3)/(MgO)$ coming to 0.09 to 0.3; the above are mixed with a solvent, organic binder, plasticizing agent and the like with the use of a ball mill or the like. If the amount of MgO added, the amount of $RE_2O_3$ added, and the total amount of both, as well as the molar ratio of the amounts of $(RE_2O_3)/(MgO)$ added, are outside the above ranges, the amount of MgO contained, the amount of $RE_2O_3$ contained, and the total amount of both, as well as the molar ratio of the amounts of $(RE_2O_3)/(MgO)$ contained, are also outside the above ranges. As a result, either the bending strength or thermal conductivity, or both, decrease, as described above. Accordingly, it is preferable that the amount of MgO added, the amount of $RE_2O_3$ added, the total amount of both, and the molar ratio of $(RE_2O_3)/(MgO)$ be within the above ranges.

Then, in a forming process, the above mixed raw slurry is defoamed and is thickened; a sheet forming process is then performed with the use of a well known doctor blade method or the like so that the slurry is formed into a plate with a predetermined thickness. It is possible for the thickness of the plate of the sheet formed body to be determined appropriately according to how the plate is to be used. For example, the thickness of the plate can be about 0.2 to 1.0 mm. As for the dimensions of the sheet formed body, the amount of contraction, as well as the dimensions and volume of a BN setter on which the sheet formed body is placed and those of a container used for the sintering, is taken into account before the dimensions of the sheet formed body are appropriately set. According to the present invention, the dimensions of the sheet formed body are 170 mm×140 mm.

Then, in a sintering process, a sheet of the sheet formed body is used, or alternatively a plurality of sheets of the sheet formed body is stacked via a parting agent such as BN. In a sintering furnace, a nitrogen pressurized atmosphere of 0.5 to 1.0 MPa is created, and the temperature is raised from 1,600 degrees Celsius at a rate of 300 degrees Celsius/h or less. The temperature is maintained at 1,800 to 2,000 degrees Celsius for two to ten hours and is then cooled down to 1,500 degrees Celsius at a rate of 100 degrees Celsius/h or more, so that the sheet formed body is sintered and turned into the silicon nitride substrate. After the sintering, the silicon nitride substrate may be used without any other processes being applied thereto. However, the following may be applied: a thermal process whose temperature is lower than the sintering temperature, and a surface treatment process that involves blast processing or the like. Incidentally, if the sintering temperature is lower than 1,800 degrees Celsius, the strength and the thermal conductivity decrease because the sintering is insufficient. If the sintering temperature is higher than 2,000 degrees Celsius, grains grow abnormally, leading to a decrease in strength. Therefore, it is preferable that the sintering temperature be within the above range. When the atmosphere inside the sintering furnace is lower than 0.5 MPa, decomposition of silicon nitride may arise during the sintering process, resulting in a decrease in strength or thermal conductivity. In order to bring the pressure to a level higher than 1.0 MPa, an expensive sintering furnace is required, driving up costs. Accordingly, it is preferable that the atmosphere in the sintering furnace be within the above range. If the rate of the temperature rising, which starts from 1,600 degrees Celsius, is made faster than 300 degrees Celsius/h, the generation of the $MgSiN_2$ crystal phase is reduced and the thermal conductivity decreases, even though the exact reason is unclear. Therefore, it is preferable that the temperature rising rate be within the above range. If the rate of the cooling, which continues until the temperature drops to 1,500 degrees Celsius, is less than 100 degrees Celsius/h, the crystallization of the grain boundary phase is accelerated and the crystal phase containing RE in a grain boundary is segregated, weakening the bonding of the silicon nitride grains and resulting in a decrease in bending strength. Accordingly, it is preferable that the cooling rate be within the above range. If the gross thickness of the substrate when being sintered (If a plurality of substrates are stacked, the gross thickness is the sum of the thickness of the substrates) is greater than 40 mm, the virtual volume of the sample increases. As a result, the cooling rate inside the sample becomes less than 100 degrees Celsius/h. Therefore, it is preferable that the gross thickness of the substrate when being sintered be less than or equal to 40 mm, more preferably less than or equal to 30 mm. If the sintering time is shorter than two hours, the generation of the $MgSiN_2$ crystal phase is reduced and the thermal conductivity degreases. Moreover, the bending strength is also down because of the insufficient sintering. If the sintering time is longer than five hours, the crystallization of the grain boundary phase is accelerated and the crystal phase containing RE in a grain boundary is precipitated, weakening the bonding of the silicon nitride grains and resulting in a decrease in bending strength. Accordingly, it is preferable that the sintering time be within the above range.

Incidentally, the vapor pressure of the grain boundary phase containing Mg components is high. Therefore, when the grain boundary phase is sintered at high temperature, volatilization and segregation can take place easily; the generation of voids in a sintered body surface layer leads to a decrease in density or a local unevenness of color tone. In order for the Mg components to remain in the substrate, a closed container made of ceramics used for the sintering, or preferably that made of BN, is used. It is important that by keeping the gas concentration of the Mg components inside the container constant and thereby reducing the volatilized Mg components, an appropriate amount of the $MgSiN_2$ phase is precipitated that can prevent the extreme decreasing of the strength and is a high thermal conductivity phase. On the other hand, the vapor pressure of the grain boundary phase containing RE is low. Compared with the grain boundary phase containing Mg, it is easy for the grain boundary phase containing RE to exist uniformly among the silicon nitride grains in a stable manner. The grain boundary phase containing RE plays an important role as the amorphous phase 12 in keeping the silicon nitride grains firmly bonded together. Accordingly, as a portion of the grain boundary phase containing RE is crystallized, it is easy for a coarse defect to occur in the grain boundary phase because of the silicon nitride grains that are insufficiently bonded together. As a result, the mechanical strength of the silicon nitride substrate decreases; cracks may be generated easily during a process of bonding the silicon nitride substrate and the metallic circuit and radiator plates together, a process of producing a power semiconductor module, or the case where stress is applied to the silicon nitride substrate due to a heat cycle that occurs as the power semiconductor module operates. The thermal conductivity of the grain boundary phase containing RE is slightly improved by the crystallization. However, the thermal conductivity is significantly lower than the silicon nitride grains and makes hardly any contribution to improving the thermal conductivity of the silicon nitride substrate. Accordingly, in order to keep the silicon nitride grains firmly bonded together, it is preferable that the grain boundary phase containing RE exists as an amorphous phase. As rare earth element RE, oxides of Y, Yb, Er, Dy, Gd, Sm, Nd and Lu can be selected. It is desirable to select the oxide of Y since the bonding strength of the silicon nitride grains and the grain boundary phase is excellent.

EXAMPLES

Hereinafter, examples of the present invention will be described. However, the present invention is not limited to the examples described below.

Based on the above production method, the silicon nitride substrate is produced; the physical properties thereof are measured. For each of the following items among production conditions, those shown in Tables 1 and 2 as production conditions are adopted (Examples 1 to 16): the amount of magnesium oxide (MgO) added, the amount of rare-earth element oxide ($RE_2O_3$) added, the total amount of MgO and $RE_2O_3$ added, the molar ratio of ($RE_2O_3$)/(MgO), the type of RE, the sintering temperature in the sintering process, the temperature rising rate, the cooling time, the sintering time and the gross thickness of the substrate. Incidentally, for ($RE_2O_3$), in Example 10 to 16, instead of Y, the oxide of Yb, Er, Dy, Gd, Sm, Nd or Lu is used as RE. The sintering takes place in a closed container made of BN for the sintering.

The following are measured as the physical properties: the presence or absence of any crystal phase other than β-type silicon nitride of the silicon nitride substrate, the amount of the $MgSiN_2$ crystal phase, the amount of magnesium oxide (MgO) contained, the amount of rare-earth element oxide ($RE_2O_3$) contained, the molar ratio of ($RE_2O_3$)/(MgO), the total amount of MgO and $RE_2O_3$ contained, bending strength, a Weibull coefficient of the bending strength, and the experimental results of thermal conductivity and thermal shock. Among the above items, a judgment is made as to whether the bending strength, the Weibull coefficient of the bending strength and the thermal conductivity are within predetermined ranges (Bending strength: 820 MPa or higher; Weibull coefficient: 15 or more; Thermal conductivity: 80 W/m·K or higher).

As comparative examples, the silicon nitride substrate is also produced by varying the above production conditions; the physical properties of the silicon nitride substrate are similarly measured and a judgment is made. The results are shown in Tables 3 to 4 (Comparative Examples 1 to 15).

Among the above physical properties, the presence or absence of any crystal phase other than β-type silicon nitride, as well as the amount of the $MgSiN_2$ crystal phase, is obtained according to the above method with the use of X-ray diffraction measurement on the surface of the substrate. For the measurement of X-ray diffraction, RINT2500 made by Rigaku Corporation is used. The measurement conditions are as follows: Source lamp: Copper; Tube voltage: 50 kV; Tube current: 200 mA; Sampling width: 0.020 degree; Scanning rate: 2 degrees/min; Scan angle 2θ: 20 to 120 degrees. The measurement is carried out in the above ranges.

The amount of magnesium oxide (MgO) contained and the amount of rare-earth element oxide ($RE_2O_3$) contained are calculated in the following manner: The silicon nitride substrate is turned into a solution by microwave digestion and acid dissolution treatment, and the amounts of Mg and RE are measured by inductively coupled plasma spectrometry and then converted to magnesium oxide (MgO) and rare-earth element oxide ($RE_2O_3$). The molar ratio of the amounts of ($RE_2O_3$)/(MgO) contained, as well as the total amount of MgO and $RE_2O_3$ contained, is calculated from the calculated amounts of magnesium oxide (MgO) and rare-earth element oxide ($RE_2O_3$) contained. In all samples of the examples and comparative examples, the amounts of MgO and $RE_2O_3$ contained are substantially equal to the amounts of MgO and $RE_2O_3$ added.

The measurement of bending strength is based on JIS-R1601 and conducted by three-point bending test. The silicon nitride substrate is processed into a test piece 4 mm wide. After the test piece is set in a three-point bending jig with a space of 7 mm between supporting rolls, a load is applied at a crosshead speed of 0.5 mm/min. The bending strength is calculated from the load that is applied to the test piece when the test piece breaks down.

As for the Weibull coefficient, on the basis of the results of the above bending strength test, what is created is a Weibull plot for plotting $\ln\ln (1-F)^{-1}$ for $\ln \sigma$ in accordance with JIS-R1625. The Weibull coefficient of the slope thereof is calculated. In this case, σ represents bending strength, and F cumulative breakdown probability.

Fracture toughness is measured in accordance with JIS-R1607 with the use of an IF (Indentation Fracture) method by which a Vickers indenter is pushed into a side face of the silicon nitride substrate with a predetermined load (2 kgf(19.6 N) in the present examples). In this case, the Vickers indenter is pushed in such away that one diagonal line of a Vickers impression is perpendicular to the thickness direction of the silicon nitride substrate.

Thermal conductivity is measured based on JIS-R1611 with the use of a laser flash method, on samples cut into 5 mm square from the silicon nitride substrate.

In a thermal shock test, on both sides of the silicon nitride substrate, a Cu circuit plate and a Cu radiator plate are formed. The silicon nitride substrate is then kept at 350 degrees Celsius for 10 minutes before being quickly cooled down to an ambient temperature. Then, whether cracks have appeared on the silicon nitride substrate is examined. The above operation is repeated 10 times and whether cracks have appeared is confirmed in order to make a determination as to whether the silicon nitride substrate is acceptable or not. The one whose thermal conductivity is less than 80 W/m·K is not suitable for the silicon nitride substrate. In this case, a thermal shock test is not conducted.

As for thermal expansion coefficients, samples cut into 5 mm×20 mm L from the silicon nitride substrate were used, a linear expansion coefficient along the longer direction is measured between an room temperature and 600 degrees Celsius in accordance with JIS-R1618.

As for a value of relative density, the density of the silicon nitride substrate is measured by Archimedian method; here, the measured density is divided by a theoretical density, which is calculated from a compounding ratio of a $Si_3N_4$ powder, MgO powder and $RE_2O_3$ powder and the density of each powder, and is multiplied by 100 to calculate the value of relative density.

TABLE 1

|  | Item | Ex. 1 | Ex. 2 | Ex. 3 | Ex. 4 | Ex. 5 | Ex. 6 | Ex. 7 | Ex. 8 |
|---|---|---|---|---|---|---|---|---|---|
|  |  | (1-1) | | | | | | | |
| Production conditions | Amount of MgO added: mol % | 6.7 | 6.7 | 9.8 | 9.8 | 9.9 | 9.9 | 13 | 13 |
|  | Amount of $RE_2O_3$ added: mol % | 1.2 | 1.8 | 1.2 | 1.8 | 2.3 | 2.9 | 1.1 | 1.7 |
|  | $RE_2O_3$/MgO | 0.2 | 0.3 | 0.1 | 0.2 | 0.2 | 0.3 | 0.09 | 0.1 |
|  | Total amount added: mol % | 7.9 | 8.5 | 11 | 11.6 | 12.2 | 12.8 | 14.1 | 14.7 |
|  | RE | Y | Y | Y | Y | Y | Y | Y | Y |
|  | Sintering temp: deg C. | 1875 | 1900 | 1850 | 1850 | 1900 | 1800 | 1850 | 1900 |
|  | Temperature rising rate: deg C./h | 150 | 150 | 150 | 150 | 300 | 150 | 150 | 300 |
|  | Cooling rate: deg C./h | 600 | 100 | 600 | 600 | 300 | 600 | 600 | 1200 |
|  | Sintering time: h | 3 | 5 | 5 | 4 | 3 | 5 | 5 | 4 |
|  | Gross thickness: mm | 0.4 | 4 | 8 | 4 | 8 | 4 | 4 | 8 |

TABLE 1-continued

| | Item | Ex. 1 | Ex. 2 | Ex. 3 | Ex. 4 | Ex. 5 | Ex. 6 | Ex. 7 | Ex. 8 |
|---|---|---|---|---|---|---|---|---|---|
| | | | | | (1-2) | | | | |
| Grain boundary/ Crystal phase | Crystal Phase | $MgSiN_2$ | $MgSiN_2$ | $MgSiN_2$ | $MgSiN_2$ | $MgSiN_2$ | $MgSiN_2$ | $MgSiN_2$ | $MgSiN_2$ |
| | Amount of $MgSiN_2$ | 0.0005 | 0.0019 | 0.0018 | 0.0017 | 0.0016 | 0.003 | 0.0016 | 0.0013 |
| | | | | | (1-3) | | | | |
| Composition | Amount of MgO contained: mol % | 6.7 | 6.7 | 9.8 | 9.8 | 9.9 | 9.9 | 13 | 13 |
| | Amount of $RE_2O_3$ contained: mol % | 1.2 | 1.8 | 1.2 | 1.8 | 2.3 | 2.9 | 1.1 | 1.7 |
| | $RE_2O_3$/MgO | 0.2 | 0.3 | 0.1 | 0.2 | 0.2 | 0.3 | 0.09 | 0.1 |
| | Total amount contained: mol % | 7.9 | 8.5 | 11 | 11.6 | 12.2 | 12.8 | 14.1 | 14.7 |
| | | | | | (1-4) | | | | |
| Characteristics | Relative density: % | 99.1 | 99.2 | 99.2 | 99.4 | 98.8 | 99.1 | 99.2 | 99.1 |
| | Thermal expansion coefficient: ppm/deg C. | 2.51 | 2.67 | 2.62 | 2.67 | 2.72 | 2.77 | 2.73 | 2.78 |
| | Bending strength: MPa | 862 | 861 | 833 | 829 | 845 | 836 | 851 | 839 |
| | Weibull coefficient | 27 | 33 | 16 | 14 | 15 | 21 | 25 | 24 |
| | Thermal conductivity: W/m · K | 90 | 94 | 89 | 88 | 85 | 89 | 89 | 89 |
| | Thermal shock test result | Acceptable | Acceptable | Acceptable | Acceptable | Acceptable | Acceptable | Acceptable | Acceptable |

TABLE 2

| | Item | Ex. 9 | Ex. 10 | Ex. 11 | Ex. 12 | Ex. 13 | Ex. 14 | Ex. 15 | Ex. 16 |
|---|---|---|---|---|---|---|---|---|---|
| | | | | | (2-1) | | | | |
| Production conditions | Amount of MgO added: mol % | 13 | 9.8 | 6.7 | 9.8 | 9.8 | 9.9 | 9.9 | 13 |
| | Amount of $RE_2O_3$ added: mol % | 2.3 | 1.2 | 1.8 | 1.2 | 1.8 | 2.3 | 2.9 | 1.1 |
| | $RE_2O_3$/MgO | 0.2 | 0.1 | 0.3 | 0.1 | 0.2 | 0.2 | 0.3 | 0.09 |
| | Total amount added: mol % | 15.3 | 11 | 8.5 | 11 | 11.6 | 12.2 | 12.8 | 14.1 |
| | RE | Y | Yb | Er | Dy | Gd | Sm | Nd | Lu |
| | Sintering temp: deg C. | 1850 | 1875 | 1850 | 1900 | 1850 | 1900 | 1850 | 1875 |
| | Temperature rising rate: deg C./h | 150 | 150 | 150 | 150 | 150 | 150 | 150 | 150 |
| | Cooling rate: deg C./h | 100 | 1200 | 600 | 300 | 600 | 1200 | 600 | 300 |
| | Sintering time: h | 10 | 5 | 5 | 4 | 2 | 5 | 4 | 3 |
| | Gross thickness: mm | 26 | 4 | 8 | 4 | 4 | 4 | 8 | 4 |
| | | | | | (2-2) | | | | |
| Grain Boundary/ Crystal Phase | Crystal Phase | $MgSiN_2$ | $MgSiN_2$ | $MgSiN_2$ | $MgSiN_2$ | $MgSiN_2$ | $MgSiN_2$ | $MgSiN_2$ | $MgSiN_2$ |
| | Amount of $MgSiN_2$ | 0.0019 | 0.0018 | 0.0019 | 0.0018 | 0.0019 | 0.0022 | 0.0028 | 0.002 |
| | | | | | (2-3) | | | | |
| Composition | Amount of MgO contained: mol % | 13 | 9.8 | 6.7 | 9.8 | 9.8 | 9.9 | 9.9 | 13 |
| | Amount of $RE_2O_3$ contained: mol % | 2.3 | 1.2 | 1.8 | 1.2 | 1.8 | 2.3 | 2.9 | 1.1 |
| | $RE_2O_3$/MgO | 0.2 | 0.1 | 0.3 | 0.1 | 0.2 | 0.2 | 0.3 | 0.09 |
| | Total amount contained: mol % | 15.3 | 11 | 8.5 | 11 | 11.6 | 12.2 | 12.8 | 14.1 |
| | | | | | (2-4) | | | | |
| Characteristics | Relative density: % | 99.4 | 98.7 | 99.1 | 99.3 | 99.1 | 99.3 | 99.4 | 99.2 |
| | Thermal expansion coefficient: ppm/deg C. | 2.83 | 2.62 | 2.69 | 2.63 | 2.64 | 2.76 | 2.78 | 2.79 |
| | Bending strength: MPa | 830 | 845 | 849 | 841 | 853 | 842 | 834 | 845 |
| | Weibull coefficient | 24 | 29 | 16 | 26 | 27 | 27 | 28 | 29 |
| | Thermal conductivity: W/m · K | 90 | 89 | 84 | 88 | 87 | 88 | 89 | 89 |
| | Thermal shock test result | Acceptable | Acceptable | Acceptable | Acceptable | Acceptable | Acceptable | Acceptable | Acceptable |

TABLE 3

| | Item | Cmp. Ex. 1 | Cmp. Ex. 2 | Cmp. Ex. 3 | Cmp. Ex. 4 | Cmp. Ex. 5 | Cmp. Ex. 6 | Cmp. Ex. 7 | Cmp. Ex. 8 |
|---|---|---|---|---|---|---|---|---|---|
| | (3-1) | | | | | | | | |
| Production conditions | Amount of MgO added: mol % | 6.7 | 6.7 | 9.8 | 9.8 | 9.9 | 9.8 | 9.8 | 9.8 |
| | Amount of $RE_2O_3$ added: mol % | 1.2 | 1.8 | 1.2 | 1.8 | 2.3 | 1.2 | 1.8 | 1.2 |
| | $RE_2O_3$/MgO | 0.2 | 0.3 | 0.1 | 0.2 | 0.2 | 0.1 | 0.2 | 0.1 |
| | Total amount added: mol % | 7.9 | 8.5 | 11 | 11.6 | 12.2 | 11 | 11.6 | 11 |
| | RE | Y | Y | Y | Y | Y | Y | Y | Y |
| | Sintering temp: deg C. | 1850 | 1900 | 1850 | 1850 | 1750 | 1850 | 1900 | 1850 |
| | Temperature rising rate: deg C./h | 150 | 150 | 400 | 600 | 200 | 150 | 150 | 300 |
| | Cooling rate: deg C./h | 80 | 50 | 600 | 600 | 300 | 600 | 600 | 600 |
| | Sintering time: h | 5 | 4 | 3 | 5 | 4 | 1 | 20 | 5 |
| | Gross thickness: mm | 4 | 4 | 8 | 4 | 4 | 4 | 4 | 51 |
| | (3-2) | | | | | | | | |
| Grain Boundary/ Crystal Phase | Crystal Phase | $Y_2Si_3O_3N_4$ $MgSiN_2$ | $Y_2Si_3O_3N_4$ $MgSiN_2$ | None | None | None | None | $Y_2Si_3O_3N_4$ $MgSiN_2$ | $Y_2Si_3O_3N_4$ $MgSiN_2$ |
| | Amount of $MgSiN_2$ | 0.0033 | 0.003 | — | — | — | — | 0.0032 | 0.0035 |
| | (3-3) | | | | | | | | |
| Composition | Amount of MgO contained: mol % | 6.7 | 6.7 | 9.8 | 9.8 | 9.9 | 9.6 | 9.8 | 9.8 |
| | Amount of $RE_2O_3$ contained: mol % | 1.2 | 1.8 | 1.2 | 1.8 | 2.3 | 1.2 | 1.8 | 1.2 |
| | $RE_2O_3$/MgO | 0.2 | 0.3 | 0.1 | 0.2 | 0.2 | 0.1 | 0.2 | 0.1 |
| | Total amount contained: mol % | 7.9 | 8.5 | 11 | 11.6 | 12.2 | 11 | 11.6 | 11 |
| | (3-4) | | | | | | | | |
| Characteristics | Relative density: % | 99.4 | 99.2 | 98.6 | 98.4 | 99.2 | 98.9 | 99.1 | 99.8 |
| | Thermal expansion coefficient: ppm/deg C. | 2.52 | 2.55 | 2.61 | 2.66 | 2.72 | 2.62 | 2.66 | 2.61 |
| | Bending strength: MPa | 798 | 802 | 825 | 842 | 734 | 771 | 766 | 810 |
| | Weibull coefficient | 14 | 13 | 21 | 28 | 16 | 20 | 13 | 13 |
| | Thermal conductivity: W/m·K | 89 | 93 | 77 | 73 | 70 | 78 | 88 | 87 |
| | Thermal shock test result | Not Acceptable | Not Acceptable | — | — | — | — | Not Acceptable | Not Acceptable |

TABLE 4

| | Item | Cmp. Ex. 9 | Cmp. Ex. 10 | Cmp. Ex. 11 | Cmp. Ex. 12 | Cmp. Ex. 13 | Cmp. Ex. 14 | Cmp. Ex. 15 | Cmp. Ex. 16 | Cmp. Ex. 17 | Cmp. Ex. 18 |
|---|---|---|---|---|---|---|---|---|---|---|---|
| | (4-1) | | | | | | | | | | |
| Production conditions | Amount of MgO added: mol % | 6.7 | 6.7 | 6.8 | 9.8 | 12.7 | 15.6 | 6.8 | 6.7 | 4.1 | 37.2 |
| | Amount of $RE_2O_3$ added: mol % | 0.6 | 2.4 | 3 | 0.6 | 0.6 | 1.7 | 3 | 1.2 | 0.5 | 4.7 |
| | $RE_2O_3$/MgO | 0.09 | 0.4 | 0.4 | 0.06 | 0.04 | 0.11 | 0.4 | 0.2 | 0.12 | 0.13 |
| | Total amount added: mol % | 7.3 | 9.1 | 9.8 | 10.4 | 13.3 | 17.3 | 9.8 | 7.9 | 4.6 | 42 |
| | RE | Y | Y | Y | Y | Y | Y | Y | Y | Y | Y |
| | Sintering temp: deg C. | 1900 | 1850 | 1900 | 1900 | 1850 | 1850 | 1900 | 1775 | 1875 | 1875 |
| | Temperature rising rate: deg C./h | 150 | 150 | 300 | 200 | 150 | 150 | 300 | 150 | 150 | 150 |
| | Cooling rate: deg C./h | 300 | 600 | 300 | 600 | 300 | 300 | 50 | 600 | 600 | 600 |

TABLE 4-continued

| | Item | Cmp. Ex. 9 | Cmp. Ex. 10 | Cmp. Ex. 11 | Cmp. Ex. 12 | Cmp. Ex. 13 | Cmp. Ex. 14 | Cmp. Ex. 15 | Cmp. Ex. 16 | Cmp. Ex. 17 | Cmp. Ex. 18 |
|---|---|---|---|---|---|---|---|---|---|---|---|
| | Sintering time: h | 4 | 5 | 4 | 3 | 3 | 5 | 5 | 3 | 3 | 3 |
| | Gross thickness: mm | 4 | 8 | 4 | 4 | 4 | 4 | 4 | 0.4 | 0.4 | 0.4 |
| Grain Boundary/ Crystal Phase | Crystal Phase | None | $Y_2Si_3O_3N_4$ $MgSiN_2$ | $Y_2Si_3O_3N_4$ $MgSiN_2$ | None | None | $MgSiN_2$ | $Y_2Si_3O_3N_4$ | $MgSiN_2$ | $MgSiN_2$ | $MgSiN_2$ |
| | Amount of $MgSiN_2$ | — | 0.0022 | 0.0021 | — | — | 0.0045 | — | 0.0003 | 0.0004 | 0.0035 |
| Composition | Amount of MgO contained: mol % | 6.7 | 6.7 | 6.8 | 9.8 | 12.7 | 15.6 | 6.8 | 6.7 | 4.1 | 37.2 |
| | Amount of $RE_2O_3$ contained: mol % | 0.6 | 2.4 | 3 | 0.6 | 0.6 | 1.7 | 3 | 1.2 | 0.5 | 4.7 |
| | $RE_2O_3$/MgO | 0.09 | 0.4 | 0.4 | 0.06 | 0.04 | 0.11 | 0.4 | 0.2 | 0.12 | 0.13 |
| | Total amount contained: mol % | 7.3 | 9.1 | 9.8 | 10.4 | 13.3 | 17.3 | 9.8 | 7.9 | 4.6 | 42 |
| Characteristics | Relative density: % | 99.6 | 99.2 | 99.1 | 99.2 | 99.1 | 99.3 | 99.1 | 97.1 | 98.2 | 98.3 |
| | Thermal expansion coefficient: ppm/deg C. | 2.46 | 2.65 | 2.65 | 2.57 | 2.68 | 2.89 | 2.66 | 2.51 | 2.26 | 4.52 |
| | Bending strength: MPa | 831 | 765 | 768 | 820 | 832 | 731 | 769 | 792 | 862 | 780 |
| | Weibull modulus | 28 | 14 | 10 | 28 | 28 | 12 | 12 | 13 | 27 | 19 |
| | Thermal conductivity: W/m·K | 77 | 82 | 97 | 78 | 78 | 88 | 76 | 79 | 79 | 65 |
| | Thermal shock test result | — | Not Acceptable | Not Acceptable | — | — | Not Acceptable | — | Not Acceptable | Not Acceptable | Not Acceptable |

TABLE 5

| Item | Grain boundary phase Mg component | Grain boundary phase Y component | $MgSiN_2$ X-ray ratio | Abundance ratio of $MgSiN_2$ in grain boundary phase (%) |
|---|---|---|---|---|
| Ex. 1 | $MgSiN_2$ | None | 0.0005 | 0.05 |
| Ex. 2 | $MgSiN_2$ | None | 0.0019 | 9.33 |
| Ex. 3 | $MgSiN_2$ | None | 0.0018 | 8.01 |
| Ex. 4 | $MgSiN_2$ | None | 0.0017 | 7.62 |
| Ex. 5 | $MgSiN_2$ | None | 0.0015 | 4.32 |
| Ex. 6 | $MgSiN_2$ | None | 0.003 | 18.54 |
| Ex. 7 | $MgSiN_2$ | None | 0.0016 | 6.25 |
| Ex. 8 | $MgSiN_2$ | None | 0.0013 | 3.21 |
| Ex. 9 | $MgSiN_2$ | None | 0.0019 | 9.25 |
| Cmp. Ex. 1 | $MgSiN_2$ | $Y_2Si_3O_3N_4$ | 0.0033 | 21.16 |
| Cmp. Ex. 2 | $MgSiN_2$ | $Y_2Si_3O_3N_4$ | 0.003 | 19.02 |
| Cmp. Ex. 7 | $MgSiN_2$ | $Y_2Si_3O_3N_4$ | 0.0032 | 20.64 |
| Cmp. Ex. 8 | $MgSiN_2$ | $Y_2Si_3O_3N_4$ | 0.0035 | 22.24 |
| Cmp. Ex. 10 | $MgSiN_2$ | $Y_2Si_3O_3N_4$ | 0.0022 | 12.28 |
| Cmp. Ex. 11 | $MgSiN_2$ | $Y_2Si_3O_3N_4$ | 0.0021 | 11.32 |
| Cmp. Ex. 14 | $MgSiN_2$ | None | 0.0045 | 32.12 |

As shown in the above Table 1, in the silicon nitride substrate that is produced under the following conditions, only the $MgSiN_2$ crystal phase is detected as the crystal phase of the grain boundary: the amount of MgO added is 6.7 to 12.8 mol %; the amount of $RE_2O_3$ added is 1.1 to 2.9 mol %; the total amount of MgO and $RE_2O_3$ added is 7.9 to 15.1 mol %; the molar ratio of the amounts of $(RE_2O_3)/(MgO)$ added is 0.09 to 0.3; the sintering temperature during the sintering process is 1,800 to 2,000 degrees Celsius; the temperature rising rate is less than or equal to 300 degrees Celsius/h; the cooling rate is greater than or equal to 100 degrees Celsius/h; the sintering time is 2 to 10 hours. Moreover, the following are all within the preset ranges: the amount of the $MgSiN_2$ crystal phase relative to β-type $Si_3N_4$ (the preset range 0.0005 to 0.003); the amount of MgO contained (the preset range 6.7 to 12.8 mol %); the amount of $RE_2O_3$ contained (the preset range 1.1 to 2.9 mol %); the total amount of MgO and $RE_2O_3$ contained (the preset range 7.9 to 15.1 mol %); the molar ratio of the amounts of $(RE_2O_3)/(MgO)$ contained (the preset range 0.09 to 0.3); bending strength (the preset range greater than or equal to 820 MPa); and thermal conductivity (the preset range greater than or equal to 80 W/m·K). The Weibull coefficient also meets the preset range, which is greater than or equal to 15; it is clear that the bending strength varies little. The relative density of the silicon nitride substrate is greater than 98%. The thermal expansion coefficient is in the range that is greater than or equal to 2.3 and less than or equal to 4.5 ppm/degree Celsius. As a result, the silicon nitride substrate does not break even in the thermal shock test; it is determined that all the silicon nitride substrates are acceptable.

Figure 4:
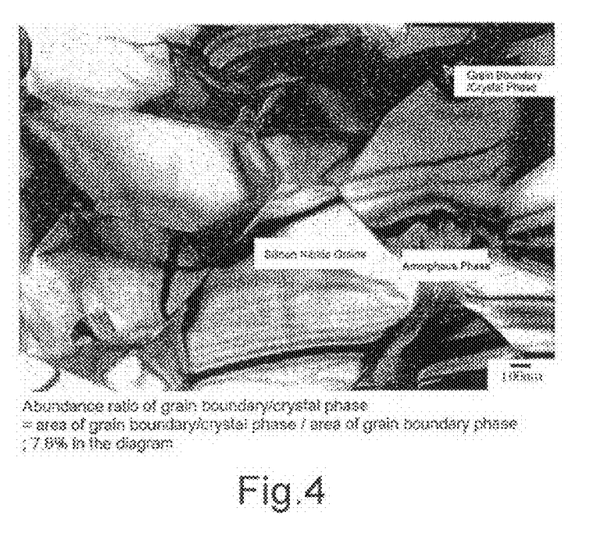
FIG. 4 shows a transmission electron microscope (TEM) image of a silicon nitride sintered body obtained in Example 2.
Figure 5:
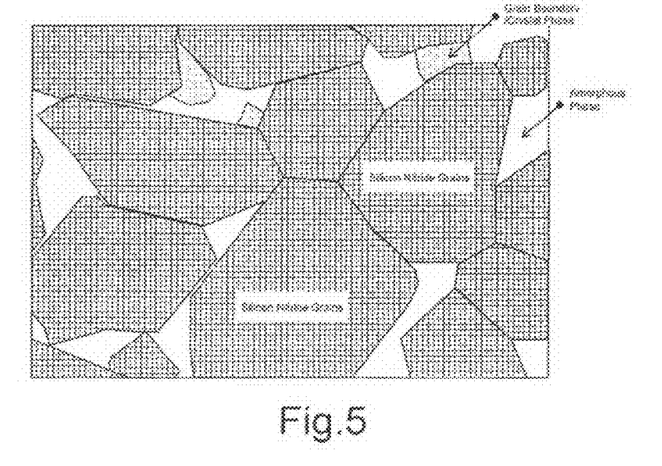
FIG. 5 is a schematic diagram of the TEM image of FIG. 4.

FIG. 4 shows a transmission electron microscope (TEM) image of the silicon nitride sintered body obtained in Example 4. FIG. 5 is a schematic diagram thereof. In this case, for TEM observation, a thin sample is made with the use of a focused ion beam (Focused Ion Beam: FIB; FB-2100 made by Hitachi, Ltd.); TEM observation is then carried out with the use of a transmission electron microscope (TEM; HF2000 made by Hitachi, Ltd.) The conditions for TEM observation are as follows: the accelerating voltage is 200 kV, and the direct observation magnification 20 k times. For the TEM image of FIG. 2, the abundance ratio (area ratio) of the grain boundary/crystal phase is calculated with the use of an image analysis device (LUZEX AP made by Nireco Corporation); the resultant value is 9.33%. The abundance ratio of the grain boundary/crystal phase is a value obtained by dividing the area of the grain boundary/crystal phase by the area of the grain boundary phase (the sum of the grain boundary/crystal phase and the amorphous phase) and then multiplying by 100. Similar measurements are carried out for Examples 1 to 3 and 5 to 9 and, in Tables 2-1 and 2-2, Comparative Examples 1, 2, 7, 8, 10, 11 and 14 in which the diffraction peak of the grain boundary/crystal phase is detected by X-ray diffraction. In each of the above cases, the abundance ratio of the grain boundary/crystal phase is calculated. Incidentally, for the samples of Comparative Examples 1, 2, 7, 8, 10 and 11, the diffraction peak of $Y_2Si_3O_3N_4$, as well as $MgSiN_2$ phase, is detected by X-ray diffraction. However, based on the results of TEM observation and TEM-EDX analysis, it is confirmed that the grain boundary/crystal phase mainly made of Mg and the one mainly made of Y are precipitated. In Comparative Examples 1, 2, 7, 8, 10 and 11, the abundance ratio of the $MgSiN_2$ phase is calculated by dividing the area of the $MgSiN_2$ phase by the grain boundary phase (which is the sum of $MgSiN_2$, $Y_2Si_3O_3N_4$ and the amorphous phase, in the above comparative examples) and multiplying by 100. Table 5 and FIG. 6 show a relationship between the abundance ratio of the grain boundary/crystal phase $MgSiN_2$ calculated by image analysis of the TEM image and a ratio (which is simply shown as "$MgSiN_2$ X-ray ratio" in Table 3) of the X-ray diffraction peak intensity of (121) of the $MgSiN_2$ crystal phase to the sum of the X-ray diffraction peak intensities of (110), (200), (101), (210), (201), (310), (320) and (002) of the crystal grains of the β-type silicon nitride of β-type $Si_3N_4$. It is clear from the diagram and the table that in Examples 1 to 9, the X-ray ratio of $MgSiN_2$ is in the range 0.0005 to 0.003 and the abundance ratio of $MgSiN_2$ in the grain boundary phase is in the range that is greater than or equal to 0.05% and less than 20%. It is obvious from FIG. 6 that there is a correlation between the X-ray ratio of $MgSiN_2$ and the abundance ratio of $MgSiN_2$ in the grain boundary phase: 0.05% for 0.0005 in Example 1, 7.62% for 0.0017 in Example 4, 18.54% for 0.003 in Example 6, and 32.12% for 0.0045 in comparative example.

Meanwhile, as shown in Table 2, in Comparative Example 1, in the silicon nitride substrate that is produced under the following conditions, the amount of the $MgSiN_2$ crystal phase is large, 0.0033 times the amount of β-type $Si_3N_4$: the amount of MgO added is 6.7 mol %; the amount of $Y_2O_3$ added is 1.2 mol %; the sintering temperature during the sintering process is 1,850 degrees Celsius; the temperature rising rate is 150 degrees Celsius/h; the cooling rate is 80 degrees Celsius/h; the sintering time is 5 hours; and the gross thickness of the substrate is 4 mm. The silicon nitride substrate also includes a crystal phase of $Y_2Si_3O_3N_4$ containing Y. The bending strength is low at 798 MPa. The Weibull coefficient thereof is also low at 14. Since the cooling rate of the sintering process is relatively slow, the crystallization of the grain boundary is accelerated. The bond between the silicon nitride grains associated with the grain boundary phase becomes weaker, and the bending strength therefore decreases. As a result, cracks have appeared in the silicon nitride substrate in the thermal shock test. Even in Comparative Example 2, which is different from Comparative Example 1 in the following points, the amount of the $MgSiN_2$ crystal phase is large, 0.0030 times the amount of β-type $Si_3N_4$, and the silicon nitride substrate also includes a crystal phase of $Y_2Si_3O_3N_4$ containing Y because of the slow cooling rate: the amount of $Y_2O_3$ added is 1.8 mol %; the sintering temperature is 1,900 degrees Celsius; the cooling rate is 50 degrees Celsius/h; and the sintering time is 4 hours. Therefore, the bending strength is low at 802 MPa; the Weibull coefficient thereof is also low at 13. As a result, cracks have appeared in the silicon nitride substrate in the thermal shock test.

In Comparative Example 3, in the silicon nitride substrate that is produced under the following conditions, the $MgSiN_2$ crystal phase is not detected and the thermal conductivity is low at 77 W/m·K: the amount of MgO added is 9.8 mol %; the amount of $Y_2O_3$ added is 1.2 mol %; the sintering temperature during the sintering process is 1,850 degrees Celsius; the temperature rising rate is 400 degrees Celsius/h; the cooling rate is 600 degrees Celsius/h; the sintering time is 3 hours; and the gross thickness of the substrate is 8 mm. The reason is that since the temperature rising rate during the sintering process is fast, the generation of the $MgSiN_2$ crystal phase is reduced. The thermal conductivity of the silicon nitride substrate decreases. Even in Comparative Example 4, which is different from Comparative Example 3 in the following points, the generation of the $MgSiN_2$ crystal phase is reduced and the thermal conductivity is down at 73 W/m·K because the temperature rising rate is fast: the amount of $Y_2O_3$ added is 1.8 mol %; the temperature rising rate is 600 degrees Celsius/h; the sintering time is 5 hours; and the gross thickness of the substrate is 4 mm.

In Comparative Example 5, in the silicon nitride substrate that is produced under the following conditions, the $MgSiN_2$ crystal phase is not detected, the thermal conductivity is low at 70 W/m·K, and the bending strength is down at 734 MPa: the amount of MgO added is 9.9 mol %; the amount of $Y_2O_3$ added is 2.3 mol %; the sintering temperature during the sintering process is 1,750 degrees Celsius; the temperature rising rate is 200 degrees Celsius/h; the cooling rate is 300 degrees Celsius/h; the sintering time is 4 hours; and the gross thickness of the substrate is 4 mm. The reason is that since the sintering temperature during the sintering process is low, the generation of the $MgSiN_2$ crystal phase is reduced. The thermal conductivity of the silicon nitride substrate decreases; the bending strength also decreases due to the insufficient sintering.

In Comparative Example 6, in the silicon nitride substrate that is produced under the following conditions, the $MgSiN_2$ crystal phase is not detected, the thermal conductivity is low at 78 W/m·K, and the bending strength is down at 771 MPa: the amount of MgO added is 9.8 mol %; the amount of $Y_2O_3$ added is 1.2 mol %; the sintering temperature during the sintering process is 1,850 degrees Celsius; the temperature rising rate is 150 degrees Celsius/h; the cooling rate is 600 degrees Celsius/h; the sintering time is 1 hour; and the gross thickness of the substrate is 4 mm. The reason is that since the sintering time for the sintering process is short, the generation of the $MgSiN_2$ crystal phase is reduced. The thermal conductivity of the silicon nitride substrate decreases; the bending strength also decreases due to the insufficient sintering.

In Comparative Example 7, in the silicon nitride substrate that is produced under the following conditions, the amount of the MgSiN$_2$ crystal phase is large, 0.0032 times the amount of β-type Si$_3$N$_4$: the amount of MgO added is 9.8 mol %; the amount of Y$_2$O$_3$ added is 1.8 mol %; the sintering temperature during the sintering process is 1,900 degrees Celsius; the temperature rising rate is 150 degrees Celsius/h; the cooling rate is 600 degrees Celsius/h; the sintering time is 20 hours; and the gross thickness of the substrate is 4 mm. The silicon nitride substrate also includes a crystal phase of Y$_2$Si$_3$O$_3$N$_4$ containing Y. The bending strength is low at 766 MPa. The Weibull coefficient thereof is also low at 13. Since the sintering time for the sintering process is long, the crystallization of the grain boundary is accelerated. The bond between the silicon nitride grains associated with the grain boundary phase becomes weaker, and the bending strength therefore decreases. As a result, cracks have appeared in the silicon nitride substrate in the thermal shock test.

In Comparative Example 8, in the silicon nitride substrate that is produced under the following conditions, the amount of the MgSiN$_2$ crystal phase is large, 0.0035 times the amount of β-type Si$_3$N$_4$: the amount of MgO added is 9.8 mol %; the amount of Y$_2$O$_3$ added is 1.2 mol %; the sintering temperature during the sintering process is 1,850 degrees Celsius; the temperature rising rate is 300 degrees Celsius/h; the cooling rate is 600 degrees Celsius/h; the sintering time is 5 hours; and the gross thickness of the substrate is 51 mm. The silicon nitride substrate also includes a crystal phase of Y$_2$Si$_3$O$_3$N$_4$ containing Y. The bending strength is low at 810 MPa. The Weibull coefficient thereof is also low at 13. Since the gross thickness of the substrate set in the sintering process is large at 51 mm, the cooling rate inside the sample becomes less than 100 degrees Celsius/hr as a result. Because the cooling rate is slow, the crystallization of the grain boundary is accelerated. The bond between the silicon nitride grains associated with the grain boundary phase becomes weaker, and the bending strength therefore decreases. As a result, cracks have appeared in the silicon nitride substrate in the thermal shock test.

In Comparative Example 9, in the silicon nitride substrate that is produced under the following conditions, the MgSiN$_2$ crystal phase is not detected, the thermal conductivity is low at 77 W/m·K, and the bending strength is down at 766 MPa: the amount of MgO added is 6.7 mol %; the amount of Y$_2$O$_3$ added is 0.6 mol %; the sintering temperature during the sintering process is 1,900 degrees Celsius; the temperature rising rate is 150 degrees Celsius/h; the cooling rate is 300 degrees Celsius/h; the sintering time is 4 hours; and the gross thickness of the substrate is 4 mm. The reason is that since the amount of Y$_2$O$_3$ added is small and since the total amount of MgO and Y$_2$O$_3$ added is also small, the generation of the MgSiN$_2$ crystal phase is reduced. The thermal conductivity of the silicon nitride substrate decreases; the bending strength also decreases due to an insufficient amount of the grain boundary phase.

In Comparative Example 10, in the silicon nitride substrate that is produced under the following conditions, a crystal phase of Y$_2$Si$_3$O$_3$N$_4$ containing Y is included, the bending strength is low at 765 MPa, and the Weibull coefficient thereof is also low at 14: the amount of MgO added is 6.7 mol %; the amount of Y$_2$O$_3$ added is 2.4 mol %; the sintering temperature during the sintering process is 1,850 degrees Celsius; the temperature rising rate is 150 degrees Celsius/h; the cooling rate is 600 degrees Celsius/h; the sintering time is 5 hours; and the gross thickness of the substrate is 8 mm. Since the molar ratio of (Y$_2$O$_3$)/(MgO) is high at 0.4, the crystallization of the grain boundary containing Y is accelerated. The bond between the silicon nitride grains associated with the grain boundary phase becomes weaker, and the bending strength therefore decreases. As a result, cracks have appeared in the silicon nitride substrate in the thermal shock test. Even in Comparative Example 11, which is different from Comparative Example 10 in the following points, since the molar ratio of (Y$_2$O$_3$)/(MgO) is high at 0.4, the crystallization of the grain boundary containing Y is accelerated, the bending strength is low at 768 MPa, and the Weibull coefficient thereof is also low at 10: the amount of MgO added is 6.8 mol %; the amount of Y$_2$O$_3$ added is 3.0 mol %; the sintering temperature is 1,900 degrees Celsius/h; the cooling rate is 300 degrees Celsius/h; the temperature rising rate is 300 degrees Celsius/h; the sintering time is 4 hours; and the gross thickness of the substrate is 4 mm. As a result, cracks have appeared in the silicon nitride substrate in the thermal shock test.

In Comparative Example 12, in the silicon nitride substrate that is produced under the following conditions, the MgSiN$_2$ crystal phase is not detected and the thermal conductivity is low at 78 W/m·K: the amount of MgO added is 9.8 mol %; the amount of Y$_2$O$_3$ added is 0.6 mol %; the sintering temperature during the sintering process is 1,900 degrees Celsius; the temperature rising rate is 200 degrees Celsius/h; the cooling rate is 600 degrees Celsius/h; the sintering time is 3 hours; and the gross thickness of the substrate is 4 mm. The reason is that since the amount of Y$_2$O$_3$ added is small and since the molar ratio of (Y$_2$O$_3$)/(MgO) is low at 0.06, the generation of the MgSiN$_2$ crystal phase is reduced. The thermal conductivity of the silicon nitride substrate decreases. Even in Comparative Example 13, in which the silicon nitride substrate is produced under different conditions from those in Comparative Example 12 in the following points, the generation of the MgSiN$_2$ crystal phase is reduced and the thermal conductivity of the silicon nitride substrate is down at 78 W/m·K because the amount of Y$_2$O$_3$ added is small and the molar ratio of (Y$_2$O$_3$)/(MgO) is low at 0.04: the amount of MgO added is 12.7 mol %; the molar ratio of (Y$_2$O$_3$)/(MgO) is 0.04; the sintering temperature during the sintering process is 1,850 degrees Celsius; the temperature rising rate is 150 degrees Celsius/h; and the cooling rate is 300 degrees Celsius/h.

In Comparative Example 14, in the silicon nitride substrate that is produced under the following conditions, the amount of the MgSiN$_2$ crystal phase is large, 0.0045 times the amount of β-type Si$_3$N$_4$, and the bending strength is low at 731 MPa and the Weibull coefficient thereof is also low at 12: the amount of MgO added is 15.6 mol %; the amount of Y$_2$O$_3$ added is 1.7 mol %; the sintering temperature during the sintering process is 1,850 degrees Celsius; the temperature rising rate is 150 degrees Celsius/h; the cooling rate is 300 degrees Celsius/h; the sintering time is 5 hours; and the gross thickness of the substrate is 4 mm. Since the amount of MgO added is large, the generation of the MgSiN$_2$ crystal phase is accelerated. The bond between the silicon nitride grains associated with the grain boundary phase becomes weaker, and the bending strength therefore decreases. As a result, cracks have appeared in the silicon nitride substrate in the thermal shock test.

In Comparative Example 15, in the silicon nitride substrate that is produced under the following conditions, the MgSiN$_2$ crystal phase is not detected, only a crystal phase of Y$_2$Si$_3$O$_3$N$_4$ containing Y is included, the thermal conductivity is low at 76 W/m·K, the bending strength is low at 769 MPa, and the Weibull coefficient thereof is also low at 12: the amount of MgO added is 6.8 mol %; the amount of Y$_2$O$_3$ added is 3.0 mol %; the sintering temperature during the sintering process is 1,900 degrees Celsius; the temperature rising rate is 300 degrees Celsius/h; the cooling rate is 50 degrees Celsius/h; the sintering time is 5 hours; and the gross thickness of the substrate is 4 mm. The reason is that since the molar ratio of (Y$_2$O$_3$)/(MgO) is high at 0.4, the generation of the MgSiN$_2$ crystal phase is reduced. The thermal conductivity of the silicon nitride substrate decreases. Moreover, since the cooling rate during the sintering process is slow, the crystallization of the grain boundary is accelerated; the bond between the silicon nitride grains associated with the grain boundary phase becomes weaker, and the bending strength decreases.

In Comparative Example 16, in the silicon nitride substrate that is produced under the following conditions, the relative density is low at 97.1%, the thermal conductivity is low at 79 W/m·K, the bending strength is low at 792 MPa, and the Weibull coefficient thereof is also low at 13: the amount of MgO added is 6.7 mol %; the amount of Y$_2$O$_3$ added is 1.2 mol %; the sintering temperature during the sintering process is 1,775 degrees Celsius; the temperature rising rate is 150 degrees Celsius/h; the cooling rate is 600 degrees Celsius/h; the sintering time is 5 hours; and the gross thickness of the substrate is 0.4 mm. The result of the thermal shock test shows that the silicon nitride substrate is not acceptable. It is difficult for the grain boundary/crystal phase MgSiN$_2$ to be precipitated, because it is impossible to acquire an amount of liquid phase necessary for crystallization as the sintering temperature decreases. The ratio of the X-ray diffraction peak intensity of (121) of the MgSiN$_2$ crystal phase to the sum of the X-ray diffraction peak intensities of (110), (200), (101), (210), (201), (310), (320) and (002) of the crystal grains of the β-type silicon nitride of β-type Si$_3$N$_4$ just comes to 0.0003. Therefore, the thermal conductivity of the silicon nitride substrate decreases.

In Comparative Example 17, in the silicon nitride substrate that is produced under the following conditions, the thermal expansion coefficient is low at 2.26 ppm/degree Celsius and the difference in thermal expansion coefficient from the Cu circuit plate is large: the amount of MgO added is 4.1 mol %; the amount of Y$_2$O$_3$ added is 0.5 mol %; the sintering temperature during the sintering process is 1,875 degrees Celsius; the temperature rising rate is 150 degrees Celsius/h; the cooling rate is 600 degrees Celsius/h; the sintering time is 5 hours; and the gross thickness of the substrate is 0.4 mm. Therefore, the difference in thermal expansion coefficient from the Cu circuit plate is large; the result of the thermal shock test shows that the silicon nitride substrate is not acceptable, even though the silicon nitride substrate is excellent in bending strength. It is difficult for the grain boundary/crystal phase MgSiN$_2$ to be precipitated, because the amounts of MgO and Y$_2$O$_3$ added are both down. Therefore, the ratio of the X-ray diffraction peak intensity of (121) of the MgSiN$_2$ crystal phase to the sum of the X-ray diffraction peak intensities of (110), (200), (101), (210), (201), (310), (320) and (002) of the crystal grains of the β-type silicon nitride of β-type Si$_3$N$_4$ just comes to 0.0004. The thermal conductivity of the silicon nitride substrate is down at 79 W/m·K.

In Comparative Example 18, in the silicon nitride substrate that is produced under the following conditions, the thermal expansion coefficient is high at 4.52 ppm/degree Celsius and the difference in thermal expansion coefficient from the Cu circuit plate is decreased: the amount of MgO added is 37.2 mol %; the amount of Y$_2$O$_3$ added is 4.7 mol %; the sintering temperature during the sintering process is 1,875 degrees Celsius; the temperature rising rate is 150 degrees Celsius/h; the cooling rate is 600 degrees Celsius/h; the sintering time is 5 hours; and the gross thickness of the substrate is 0.4 mm. However, the thermal contraction of the substrate increases. Moreover, since the abundance ratio of the grain boundary phase increases, the thermal conductivity is down at 65 W/m·K. The bending strength is also down at 780 MPa. The result of the thermal shock test shows that the silicon nitride substrate is not acceptable.

As the amounts of MgO and Y$_2$O$_3$ added increase, it becomes easier for the excess MgSiN$_2$ crystal phase to be separated out in the grain boundary phase. The ratio of the X-ray diffraction peak intensity of (121) of the MgSiN$_2$ crystal phase to the sum of the X-ray diffraction peak intensities of (110), (200), (101), (210), (201), (310), (320) and (002) of the crystal grains of the β-type silicon nitride of β-type Si$_3$N$_4$ rises to 0.0035. Since the abundance ratio of the grain boundary/crystal phase whose bonding strength to the βSi$_3$N$_4$ grains is small increases, the bending strength of the silicon nitride substrate decreases.

As described above, in the silicon nitride substrate that is produced in the preset ranges of the production conditions shown in Table 1, the grain boundary phase is composed of the amorphous phase and the MgSiN$_2$ crystal phase, the crystal phase containing a rare-earth element (RE) is not included, the amount of the MgSiN$_2$ phase and other characteristics are within the preset ranges shown in FIG. 1, cracks do not appear in the silicon nitride substrate, and the silicon nitride substrate does not break. However, it is clear that, when any of the production conditions is not within the preset ranges, the thermal conductivity of the silicon nitride substrate decreases, or the silicon nitride substrate breaks.

REFERENCE SIGNS LIST

10: Silicon nitride substrate
11: Silicon nitride grains
12: Amorphous grain boundary phase
13: Crystalline grain boundary phase

The invention claimed is:

1. A silicon nitride sintered body, consisting of crystal grains of β-type silicon nitride and a grain boundary phase containing at least one type of rare earth element (RE), magnesium (Mg) and silicon (Si), wherein:
    the grain boundary phase comprises an amorphous phase and a MgSiN$_2$ crystal phase;
    the X-ray diffraction line peak intensity of any crystal plane of a crystal phase containing the rare earth element (RE) is less than 0.0005 times the sum of the diffraction peak intensities of (110), (200), (101), (210), (201), (310), (320) and (002) of the crystal grains of the β-type silicon nitride;
    the X-ray diffraction peak intensity of (121) of the MgSiN$_2$ crystal phase is 0.0005 to 0.0019 times the sum of the X-ray diffraction peak intensities of (110), (200), (101), (210), (201), (310), (320) and (002) of the crystal grains of the β-type silicon nitride, and
    the silicon nitride sintered body contains magnesium (Mg) with 6.7 to 9.9 mol % of magnesium oxide (MgO), and at least one type of rare earth element (RE) with 1.2 to 2.3 mol % of rare-earth element oxide (RE$_2$O$_3$), the total amount of MgO and RE$_2$O$_3$ contained is 7.9 to 12.2 mol %, and a molar ratio of (RE$_2$O$_3$)/(MgO) is 0.1 to 0.3.

2. The silicon nitride sintered body according to claim 1, wherein thermal conductivity is 84 W/m·K or more.

3. The silicon nitride sintered body according to claim 1, wherein the silicon nitride sintered body contains magnesium (Mg) with 6.7 to 9.8 mol % of magnesium oxide (MgO), and at least one type of rare earth element (RE) with 1.2 to 1.8 mol % of rare-earth element oxide (RE$_2$O$_3$), the total amount of MgO and RE$_2$O$_3$ contained is 7.9 to 11.0 mol %.

4. A method of producing the silicon nitride sintered body according to claim 1, comprising:
    mixing 6.7 to 9.9 mol % of magnesium oxide (MgO) and 1.2 to 2.3 mol % of at least one type of rare-earth element oxide (RE$_2$O$_3$) into a base powder of silicon nitride whose oxygen content is less than or equal to 2.0 percent by mass so that the total amount comes to 7.9 to 12.2 mol % and the molar ratio of $(RE_2O_3)/MgO$ to 0.1 to 0.3;

forming a sheet formed body that is 40 mm or less in total thickness;

heating the sheet formed body from 1,600 degrees Celsius to a temperature between 1800 degrees Celsius and 2000 degrees Celsius, at a heating rate of 300 degrees Celsius/h or less; and cooling the sheet formed body down to 1,500 degrees Celsius at a cooling rate of 100 degrees Celsius/h or more for sintering after keeping the sheet formed body for 2 to 5 hours.

5. A silicon nitride circuit substrate comprising:

a silicon nitride substrate made of the silicon nitride sintered body according to claim 1;

a metallic circuit plate that is bonded to one side of the silicon nitride substrate; and a metallic radiator plate that is bonded to the other side of the silicon nitride substrate.

6. A semiconductor module comprising:

the silicon nitride circuit substrate according to claim 5; and a semiconductor element mounted on the silicon nitride circuit substrate.

7. The silicon nitride sintered body according to claim 1, wherein bending strength is 829 MPa or higher.

8. The method of producing a silicon nitride sintered body according to claim 4, wherein mixing 6.7 to 9.8 mol % of the MgO and 1.2 to 1.8 mol % of the $RE_2O_3$; so that the total amount comes to 7.9 to 11.0 mol %.

* * * * *